(12) United States Patent
Anderson et al.

(10) Patent No.: US 7,952,088 B2
(45) Date of Patent: May 31, 2011

(54) SEMICONDUCTING DEVICE HAVING GRAPHENE CHANNEL

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 396 days.

(21) Appl. No.: 12/171,312

(22) Filed: Jul. 11, 2008

(65) Prior Publication Data

US 2010/0006823 A1      Jan. 14, 2010

(51) Int. Cl.
*H01L 29/24* (2006.01)
*H01L 21/335* (2006.01)

(52) U.S. Cl. .............. 257/24; 257/E21.448; 438/195

(58) Field of Classification Search .......... 257/24, 257/27, E51.04, E23.03, E23.074, E23.117, 257/E23.165, E21.005, E21.041, E21.128, 257/E21.27, E51.038, E21.448, E29.1; 438/195
See application file for complete search history.

(56) References Cited

U.S. PATENT DOCUMENTS

| | | | |
|---|---|---|---|
| 2003/0211649 A1* | 11/2003 | Hirai et al. | 438/48 |
| 2005/0212014 A1* | 9/2005 | Horibe et al. | 257/213 |
| 2006/0099750 A1 | 5/2006 | DeHeer et al. | |
| 2007/0014151 A1* | 1/2007 | Zhang et al. | 365/185.01 |

OTHER PUBLICATIONS

Iikawa et al , "Metamorphosis of Ultra-Thin Top Si Layer of SOI Substrate Into 3C-Sic Using Rapid Thermal Process" H., Osaka Prefecture University, 2004IMFEDK.
John Toon, "Carbon-Based Electronics: Researchers Develop Foundation Circuitry and Devices Based on Graphite", Georgia Research Tech News, Mar. 14, 2006.
Peter Singer, "Graphene-Based Devices Use Electron Diffraction", Semiconductor International, Reed Business Information, 2006.

* cited by examiner

*Primary Examiner* — Evan Pert
*Assistant Examiner* — Selim Ahmed
(74) *Attorney, Agent, or Firm* — Scully, Scott, Murphy & Presser, P.C.; Richard M. Kotulak, Esq.

(57) ABSTRACT

The present invention, in one embodiment, provides a semiconductor device including a substrate having an dielectric layer; at least one graphene layer overlying the dielectric layer; a back gate structure underlying the at least one graphene layer; and a semiconductor-containing layer present on the at least one graphene layer, the semiconductor-containing layer including a source region and a drain region separated by an upper gate structure, wherein the upper gate structure is positioned overlying the back gate structure.

20 Claims, 10 Drawing Sheets

SEMICONDUCTING DEVICE HAVING GRAPHENE CHANNEL

FIELD OF THE INVENTION

The present invention relates to semiconductor devices and methods for forming semiconductor devices. More particularly, the present invention relates to semiconductor devices including a channel region composed of graphene.

BACKGROUND OF THE INVENTION

In modern microelectronic integrated-circuit technology, a silicon wafer is lithographically patterned to accommodate a large number of interconnected electronic components (field effect transistors, resistors, capacitors, etc). The technology relies on the semiconducting properties of silicon and on lithographic patterning methods. Increasing the density of electronic components and reducing the power consumption per component are two objectives in the microelectronics industry, which have driven the steady reduction in the size of the components in the past decades. However, miniaturization of silicon-based electronics will reach a limit in the near future, primarily because of limitations imposed by the material properties of silicon, and doped silicon, at the nanoscale level.

To sustain the current trend in microelectronics beyond the limits imposed by silicon-based microelectronics technologies, alternative technologies need to be developed. Requirements for such an alternative technology include: smaller feature sizes than feasible with silicon-based microelectronics, more energy-efficient electronic strategies, and production processes that allow large-scale integration, preferably using lithographic patterning methods related to those used in silicon-based microelectronic fabrication.

SUMMARY OF THE INVENTION

In one embodiment, a semiconductor device is provided that includes a graphene layer as the channel of the device. Broadly, the present invention provides a semiconductor device that includes:
a substrate having a dielectric layer;
at least one graphene layer overlying the dielectric layer;
a back gate structure underlying the at least one graphene layer; and
a semiconductor-containing layer present on the at least one graphene layer, the semiconductor-containing layer including a source region and a drain region separated by an upper gate structure, wherein the upper gate structure is positioned overlying the back gate structure.

In another aspect, a method of forming a semiconductor device is provided that includes a graphene layer as the channel of the device. Broadly, the method of forming the semiconductor device includes:
providing at least one graphene layer on a substrate and a semiconductor-containing layer on the at least one graphene layer;
forming a dielectric layer comprising a first conductivity type dopant on the semiconductor-containing layer;
etching the dielectric layer comprising the first conductivity type dopant to expose a portion of the semiconductor-containing layer;
implanting a gate dopant of a second conductivity type, opposite that of the first conductivity type, into the exposed portion of the semiconductor-containing layer to provide an upper gate structure and into the substrate underlying the upper gate structure to provide a back gate structure; and
diffusing the first conductivity type dopant from the dielectric layer comprising the first conductivity type dopant into the semiconductor-containing layer to provide a source region and a drain region adjacent to the upper gate structure.

In another embodiment, the method of forming the semiconducting device includes:
providing at least one graphene layer on a carrier substrate;
providing a semiconductor substrate including a buried dielectric layer positioned thereon, wherein a back gate structure is present enclosed within the buried dielectric layer;
bonding the at least one graphene layer on the carrier substrate to the buried dielectric layer that is positioned on the semiconductor substrate;
removing a portion of the carrier substrate, wherein a remaining portion of the carrier substrate provides a semiconductor-containing layer;
forming a dielectric layer comprising a first conductivity type dopant on the semiconductor containing layer;
patterning and etching the dielectric layer comprising the first conductivity type dopant to expose a portion of the semiconductor-containing layer;
implanting a gate dopant of a second conductivity type, opposite that of the first conductivity type, into the exposed portion of the semiconductor-containing layer to provide an upper gate structure; and
diffusing the first type dopant from the dielectric layer comprising the first type dopant into the semiconductor-containing layer to provide a source region and a drain region adjacent to the upper gate structure.

DETAILED DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
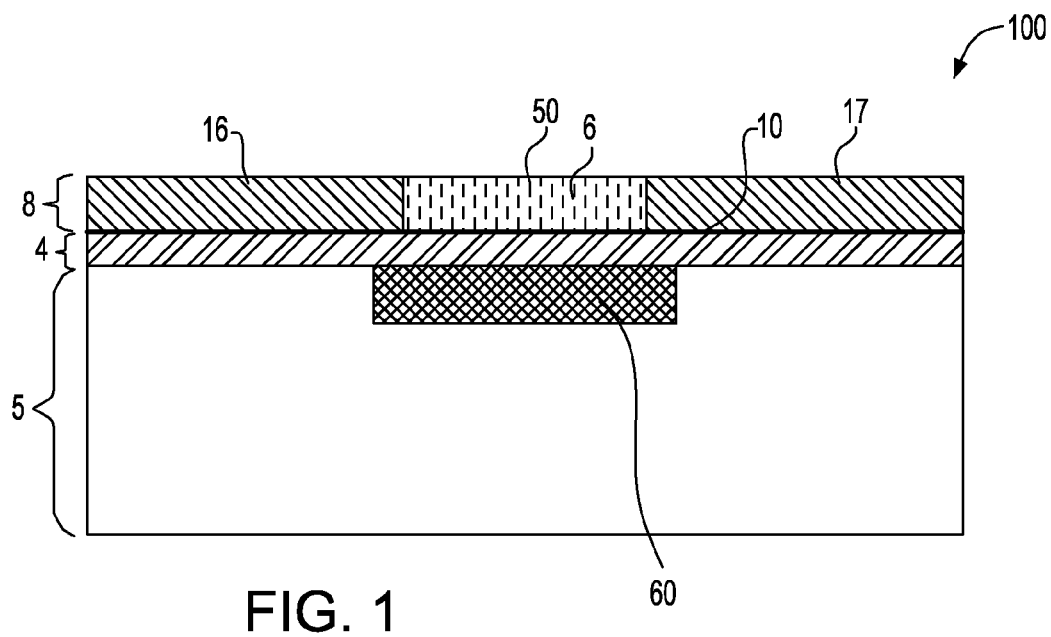
FIG. 1 is a side cross-sectional view of one embodiment of a semiconductor device including at least one graphene layer as the channel of the device, a junction isolated gate, and a junction isolated back gate present underlying a dielectric layer, in accordance with the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

In one embodiment, the present invention relates to a semiconductor device having a channel composed of at least one graphene layer and a method of forming the aforementioned device. When describing the following structures and methods, the following terms have the following meanings, unless otherwise indicated.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor classify it as either an n-type or p-type semiconductor.

As used herein, a "p-type" refers to the addition of impurities to an intrinsic semiconductor that create deficiencies of valence electrons.

As used herein, an "n-type" refers to the addition of impurities that contribute free electrons to an intrinsic semiconductor.

As used herein, the term "conductivity type" denotes a dopant region being p-type or n-type.

A "gate structure" means a structure used to control output current (i.e. flow of carriers in the channel) of a semiconducting device through electrical or magnetic fields.

As used herein, an "upper gate structure" denotes a gate structure that is positioned overlying the channel region of a semiconducting device.

As used herein, a "back gate structure" denotes a gate structure that is positioned underlying a side of the channel opposing the side of the channel on which the upper gate is overlying.

As used herein, the term "channel" is the region underlying the upper gate structure and between the source region and drain region that becomes conductive when the semiconductor device is turned on.

As used herein, the term "drain region" means a doped region in a semiconductor device located at the end of the channel from which carriers are flowing out of the semiconductor device through the drain.

As used herein, the term "source region" is a doped region in a semiconductor device from which majority carriers are flowing into the channel.

As used herein, a "metal" is an electrically conductive material, in which the metal atoms are held together by the force of metallic bond and the (intrinsic) Fermi level of the metal is above the conduction band.

A "metal semiconductor alloy" is an alloy of a metal and silicon.

As used herein, a "junction isolated gate" refers to a gate which is formed in a region of a semiconductor by virtue of being doped with doping of conductivity type opposite that of the channel conductivity type, and having no insulating material separating the channel region and the gate region.

As used herein, "graphene layer" is a planar sheet of sp2-bonded carbon atoms that are packed in a honeycomb crystal lattice, which is at least one atomic layer thick.

As used herein, the terms "dielectric", "insulating" or "insulating properties" denote a material having a room temperature conductivity of less than about $10^{-10}(\Omega\text{-m})^{-1}$ The terms "overlying" and "underlying" mean that a first element, such as a first structure, e.g., a first layer, is present on a second element, such as a second structure, e.g., a second layer, wherein intervening elements, such as an interface structure, e.g. interface layer, may be present between the first element and the second element.

The term "direct physical contact", "atop", "positioned on" or "positioned atop" means that a first element, such as a first structure, and a second element, such as a second structure, are connected without any intermediary conducting, insulating or semiconductor layers at the interface of the two elements.

FIGS. 1, 2, 3, and 4 depict embodiments of a semiconducting device 100 including a substrate 5 including a dielectric layer 4 and a back gate structure 60 underlying the dielectric layer 4, at least one graphene layer 10 formed overlying the dielectric layer 4, and a semiconductor-containing layer 8, such as a silicon carbon layer, atop the at least one graphene layer 10. In one embodiment, the semiconductor-containing layer 8 includes a source region 16 and a drain region 17 separated by an upper gate structure 50, wherein the upper gate structure 50 is positioned overlying the back gate structure 60.

The at least one graphene layer 10 may be made narrow, i.e., between about 5 nm to about 20 nm, or multiple atomic layers may be employed, in order to impart a band-gap in the graphene layer. In another embodiment, the at least one graphene layer 10 is composed of a single layer of carbon atoms. In one embodiment, the at least one graphene layer 10 is composed of up to 20 layers of single layer carbon atoms. In one embodiment, the layer of graphene is between 5 nm and 10 nm wide by virtue of patterning.

Referring to FIG. 1, the upper gate structure 50 of the semiconductor device 100 is a junction isolated gate, and the back gate structure 60 of the device is an insulated gate structure. Insulated gate structure means that the back gate conductor 7 is electrically insulated from the body of the semiconductor device 100 by a portion of the dielectric layer 4, hence the back gate conductor 7 is insulated (electrically) from the body.

In one embodiment, the source region 16, the drain region 17 and the back gate structure 60 are composed of a first type dopant, and the upper gate structure 50 is composed of a second type dopant. For example, the upper gate structure 50 may be composed of a p-type dopant, e.g., $P^+$, the source region 16 and the drain region 17 that are adjacent the upper gate structure 50, as well as the back gate structure 60 are composed of an n-type dopant, e.g., $N^+$. In one embodiment, the back gate structure 60 comprises a back gate conductor 7 comprising a refractory metal, such as tungsten. In an alternative embodiment the back gate conductor 7 comprises a doped semiconductor, such as arsenic-doped polysilicon.

Figure 2:
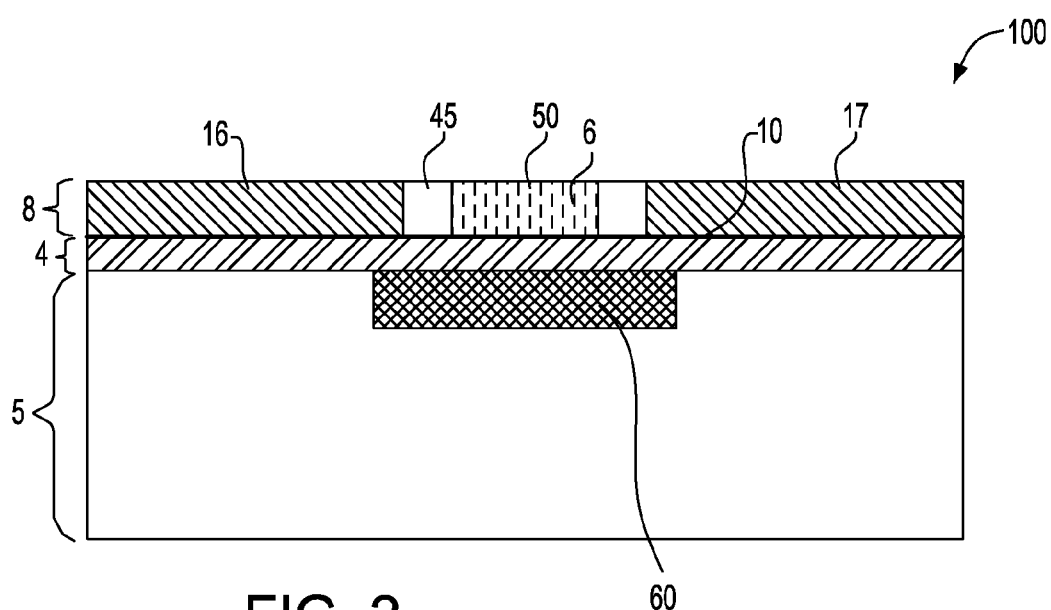
FIG. 2 is a side cross-sectional view of one embodiment of a semiconductor device including at least one graphene layer as the channel of the device, an insulator isolated gate, and a junction isolated back gate present underlying an insulating layer, in accordance with the present invention.

Referring to FIG. 2, in one embodiment, the upper gate structure 50 of the semiconductor device 100 includes an upper gate conductor 6 that is isolated from the source region 16 and drain region 17 of the device by a dielectric spacer 45, and the back gate structure 60 of the device is an insulated gate structure. In one embodiment, the source region 16, drain region 17 may be doped with a first type dopant, such as an n-type dopant, e.g., $N^+$, and the upper gate structure 50 is doped with a type dopant, such as an p-type dopant, e.g., boron. In one embodiment, the back gate structure 60 comprises a first-type doped semiconductor, such as an arsenic-doped polysilicon.

Figure 3:
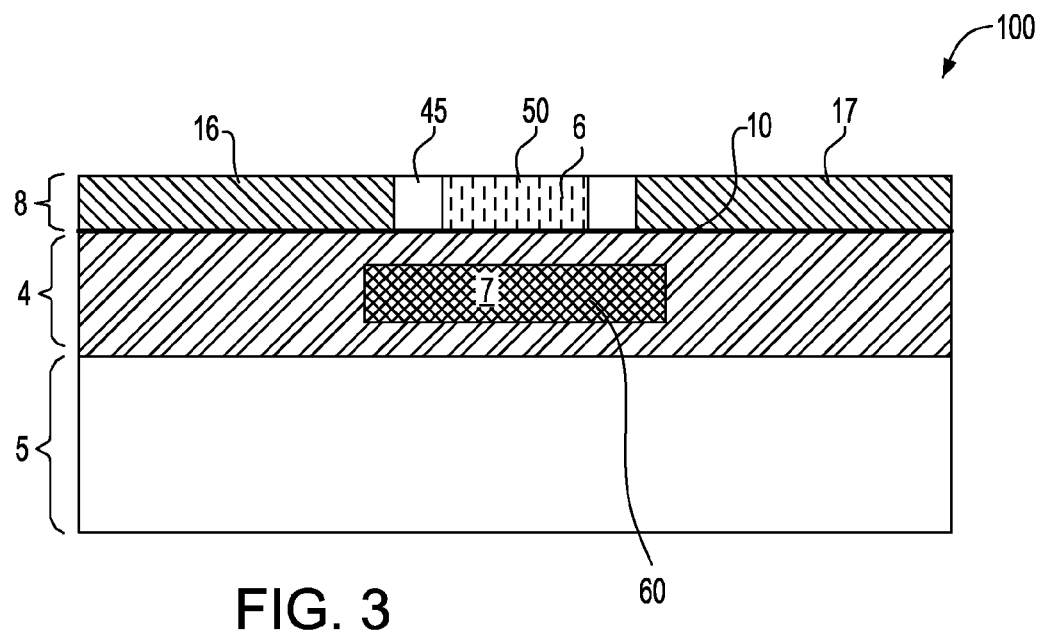
FIG. 3 is a side cross-sectional view of a semiconductor device including at least one graphene layer as the channel of the device, an insulator isolated gate, and a back gate structure present enclosed within a dielectric layer, in accordance with the present invention.

Referring to FIG. 3, in one embodiment, the upper gate structure 50 of the semiconductor device 100 includes an upper gate conductor 6 that is isolated from the source region 16 and drain region 17 of the device by a dielectric spacer 45, and the back gate structure 60 of the device includes a back gate conductor 7 encapsulated within the dielectric layer 4. By "encapsulated" it is meant that the entire back gate conductor 7 is contained within the boundaries of the dielectric layer 4. By containing the entire back gate conductor 7 within the boundaries of the dielectric layer 4, the back gate structure 60 is an insulator isolated back gate structure. In one embodiment, the dielectric layer 4 is a buried oxide layer.

Still referring to FIG. 3, in one embodiment, the source region 16 and drain region 17 are doped with a first type dopant, such as an n-type dopant, e.g., nitrogen, and the upper gate structure 50 is doped with a second type dopant, such an p-type dopant, e.g., boron, wherein the back gate structure 60 comprises a metal gate electrode, e.g. tungsten, or a doped semiconductor gate electrode, e.g. arsenic-doped polysilicon, and an insulating gate dielectric, e.g. silicon dioxide.

Figure 4:
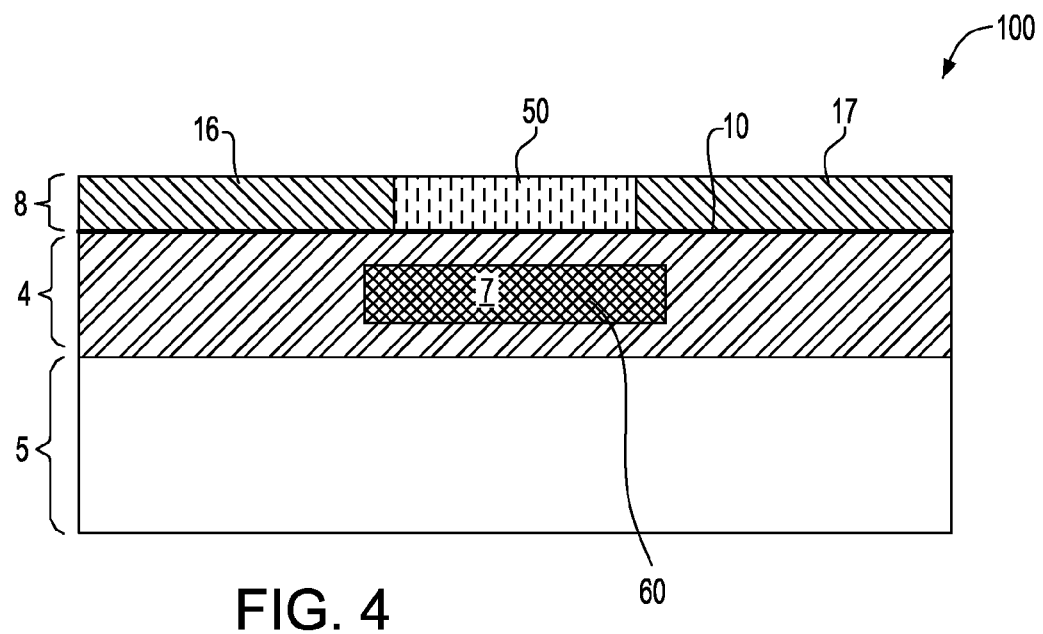
FIG. 4 is a side cross-sectional view of one embodiment of a semiconductor device including at least one graphene layer as the channel of the device, a junction isolated gate, and a back gate structure present enclosed within an insulating layer, in accordance with the present invention.

Referring to FIG. 4, in one embodiment, the upper gate structure 50 of the semiconductor device 100 is a junction-isolated gate, and the back gate structure 60 of the device is an insulated gate, wherein the back gate structure 60 of the device includes a back gate conductor 7 encapsulated within the dielectric layer 4. In one embodiment, the source region 16 and drain region 17 are doped with a first type dopant, such as an n-type dopant, e.g., nitrogen, and the upper gate structure 50 is doped with a second type dopant, such an p-type dopant, e.g., boron, wherein the back gate structure 60 comprises a metal gate electrode, e.g. tungsten, or a doped semiconductor gate electrode, e.g. arsenic-doped polysilicon, and an insulating gate dielectric, e.g. silicon dioxide.

Figure 5:
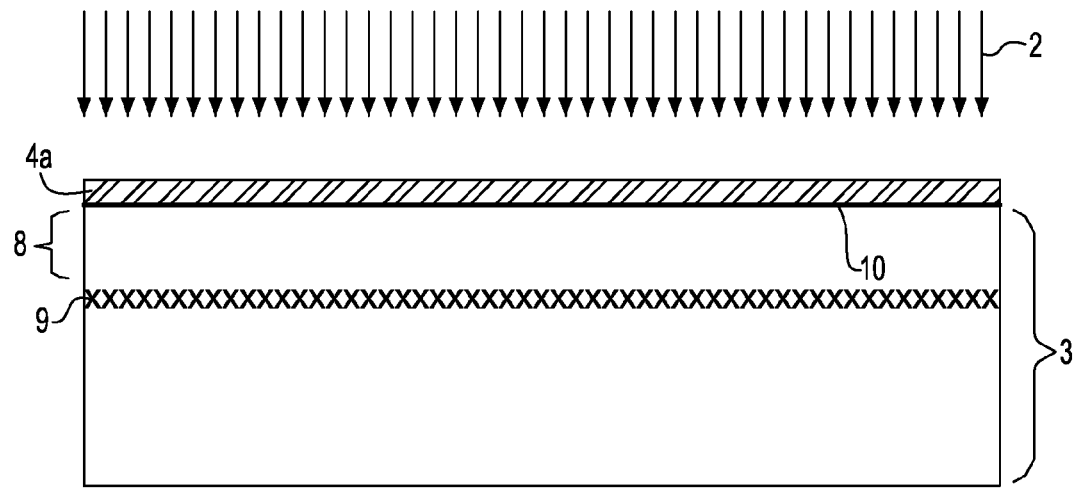
FIGS. 5-7 are side cross-sectional views depicting a structure that is produced following the initial steps of a method for providing at least one graphene layer on a substrate and a silicon-containing layer on the at least one graphene layer, in accordance with one embodiment of the present invention.
Figure 6:
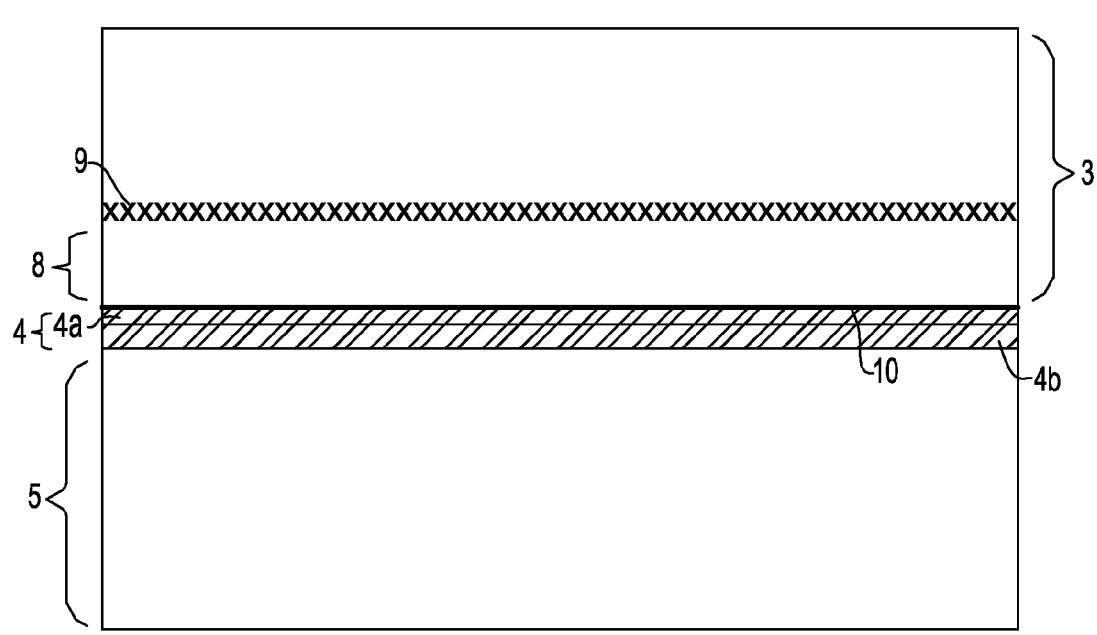
Figure 7:
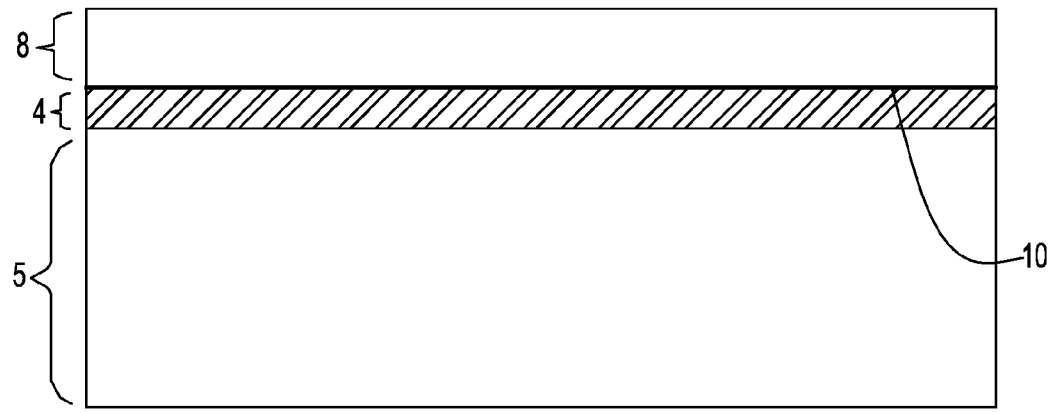

The various components of the structure shown in FIGS. 1-4, as well as embodiments of the process that can be used in forming the devices depicted in FIGS. 1-4, or devices similar to the structures depicted in FIGS. 1-4, will now be described in greater detail referring to FIGS. 5-22. FIGS. 5-11 depict one embodiment of a method for forming the semiconducting device 100 depicted in FIG. 1. FIGS. 5-7 depict the initial steps of a method for providing a semiconductor device 100 including at least one graphene layer 10 as the channel of the device, in which the structure following the initial steps includes at least one graphene layer 10 on a semiconductor substrate 5 and a semiconductor-containing layer 8, on the at least one graphene layer 10, as depicted in FIG. 7.

FIG. 5 depicts one embodiment of a forming at least one graphene layer 10 atop a carrier substrate 3, such as a semiconductor-containing substrate, such as a Si-containing substrate. In one embodiment, the carrier substrate 3 is composed of at least silicon and carbon. In one embodiment, the carrier substrate 3 is silicon carbide.

In one embodiment, the graphene layer 10 is formed atop the carrier substrate 3 using a thermal treatment, such as annealing. In one embodiment, the carrier substrate 3 is heated from about 1000° C. to about 1400° C. for about 20 minutes at a vacuum of about $10^{-6}$ Torr. In one embodiment, the annealing step is achieved using rapid thermal anneal. In another embodiment, the annealing step includes electron beam heating of the carrier substrate 3 at a pressure of approximately $10^{-10}$ Torr for a time period ranging from about 1 minute to about 20 minutes.

In one embodiment, at least one graphene layer 10 is a single layer of carbon atoms that forms a uniform layer. In another embodiment, at least one graphene layer 10 implies a plurality of layers of carbon atoms. For example, at least one graphene layer 10 may be composed of 20 layers of carbon atoms, each layer being approximately a single atom of carbon thick, but spaced by about 3.4 Å, wherein 20 layers of carbon atoms may have a physical thickness of about 70 Å. While a minimal number of graphene layers is preferred in some applications, up to 100 graphene layers may be formed without departing from the scope of the invention.

Still referring to FIG. 5, in a following process step, a first dielectric layer 4a is then formed atop at least one graphene layer 10. The first dielectric layer 4a may be an oxide, nitride, oxynitride or other insulating material. In one embodiment, the first dielectric layer 4a is composed of $SiO_2$. The first dielectric layer 4a may be formed using a deposition processes, such as chemical vapor deposition. Chemical vapor deposition is a deposition process in which a deposited species is formed as a result of a chemical reaction between gaseous reactants at greater than room temperature (25° C. to 600° C.); wherein solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD) Plasma Enhanced CVD (EPCVD), Metal-Organic CVD (MOCVD) and combinations thereof may also be employed.

The first dielectric layer 4a may have a thickness from about 10 nm to about 500 nm. More typically, the first dielectric layer 4a may have a thickness ranging from about 20 nm to about 100 nm.

In a next process step, a damage interface 9 is formed within the carrier substrate 3 by implanting hydrogen ions 2, or other like ions, into the carrier substrate 3. In one embodiment, the hydrogen ions may be implanted by ion implantation using a dosage ranging from about $1 \times 10^{16}$ atoms/cm$^2$ to about $2 \times 10^{17}$ atoms/cm$^2$. The hydrogen atoms may be implanted using an implantation energy ranging from about 50 keV to about 150 keV.

Following the formation of the damaged interface 9, the upper surface of the first dielectric layer 4a is processed to provide a planar surface for wafer bonding. In one embodiment, the upper surface of the first dielectric layer 4a is subjected to a planarization process, such as chemical mechanical polishing (CMP) or grinding, such that the upper remaining surface of the first dielectric layer 4a is substantially planar.

Referring to FIG. 6, the carrier substrate 3 including at least one graphene layer 10 and the first dielectric layer 4a is then inverted and bonded to a second substrate, i.e., substrate 5, hereafter referred to as a semiconductor substrate 5, using a thermal bonding method.

The semiconductor substrate 5 is typically composed of any semiconducting material such as Si, SiGe, GaAs, InAs and other like semiconductors. In one embodiment, the semiconductor substrate 5 is composed of a Si-containing material. Si-containing materials include, but are not limited to: Si, single crystal Si, polycrystalline Si, SiGe, amorphous Si, silicon-on-insulator substrates (SOI), SiGe-on-insulator (SGOI), annealed poly Si, and poly Si line structures. The Si-containing material may be the substrate of the device, or a Si-containing layer formed atop the substrate, e.g., a polySi gate or a raised source/drain region.

A second dielectric layer 4b, which may be referred to as a bonding layer, is then formed on the semiconductor substrate 5 using deposition and planarization processes. In one embodiment, the second dielectric layer 4b is composed of an oxide, nitride, or oxynitride material. The second dielectric layer 4b may be deposited using chemical vapor deposition. Following deposition, the second dielectric layer 4b may be planarized to produce a planar bonding layer using planarization methods, such as chemical mechanical planarization (CMP). In one embodiment, the second dielectric layer 4b is an oxide having a thickness ranging from about 100 nm to about 200 nm. In another embodiment, the second dielectric layer 4b is composed of $SiO_2$ having a thickness of approximately 150 nm.

In a next process sequence, the second dielectric layer 4b is bonded to the first dielectric layer 4a. Bonding is achieved by first bringing the second dielectric layer 4b of the semiconductor substrate 5 into direct physical contact with the upper surface of the first dielectric layer 4a present on at least one graphene layer 10 on the carrier substrate 3; optionally applying an external force; and then heating the two contacted surfaces under conditions that are capable of bonding. The heating step may be performed in the presence or absence of an external force. In one embodiment, the heating step is typically performed in an inert ambient at a temperature from about 200° to about 1050° C. for a time period from about 2 hours to about 20 hours. In another embodiment, the bonding is performed at a temperature from about 200° to about 400° C. for a time period from about 2 to about 20 hours. The term "inert ambient" is used in the present invention to denote an atmosphere in which an inert gas, such as He, Ar, $N_2$, Xe, Kr or a mixture thereof, is employed. Following the bonding of the first dielectric layer 4a to the second dielectric layer 4b, the combined structure is hereafter referred to as the dielectric layer 4.

Referring to FIG. 7, during bonding or following bonding, the carrier substrate 3 is then separated about the damaged interface 9, in which a portion of the carrier substrate 3 positioned below the damaged region 9 is removed and a portion 8 of the carrier substrate 3 above the damaged interface 9 remains.

In one embodiment, the remaining portion 8 of the carrier substrate 3 is then subjected to a planarization process, such as chemical mechanical polishing (CMP) or grinding. As used herein, planarization is a material removal process that employs at least mechanical forces, such as frictional media, to produce a planar surface. Chemical mechanical planarization (CMP) is a material removal process using both chemical reactions and mechanical forces to remove material and planarize a surface. The remaining portion 8 of the carrier substrate 3 is hereafter referred to as the semiconductor-containing layer 8.

Figure 8:
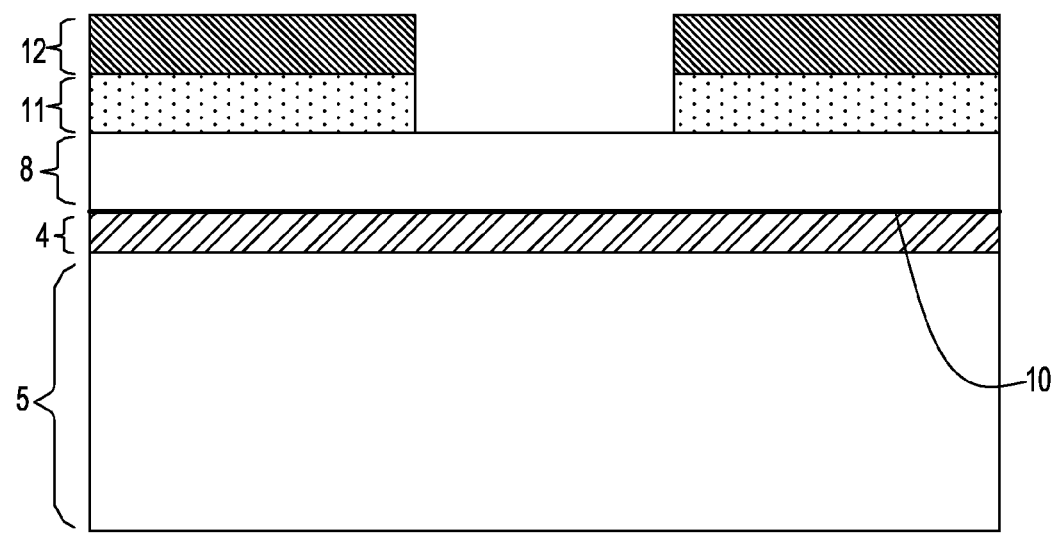
FIG. 8 is a side cross-sectional view depicting forming a dielectric layer including a first conductivity type dopant atop the semiconductor-containing layer and patterning and etching the dielectric layer to expose a portion of the semiconductor-containing layer, in accordance with one embodiment of the present invention.

Referring to FIG. 8 and in a next process step, a dielectric layer including a first conductivity type dopant 11 is formed atop the semiconductor-containing layer 8, wherein the dielectric layer is patterned and etched to expose a portion of the silicon-containing layer, in accordance with one embodiment of the present invention.

Forming the dielectric layer having the first conductivity type dopant 11 may include forming a dielectric stack atop the semiconductor-containing layer 8, wherein the dielectric stack includes the dielectric layer having the first conductivity type dopant 11 atop the semiconductor-containing layer 8, and a protective dielectric layer 12 atop the dielectric layer having the first conductivity type dopant 11.

The dielectric layer having the first conductivity type dopant 11 may be composed of an oxide, nitride, or oxynitride material that has been doped with a dopant of a first conductivity type, such as a p-type dopant or an n-type dopant. In one embodiment, the dopant is an n-type dopant, such as nitrogen. In one embodiment, the dielectric layer having the first conductivity type dopant 11 is deposited using chemical vapor deposition (CVD), wherein the dopant is integrated in situ. In another embodiment, the dielectric layer having the first conductivity type dopant 11 is composed of TEOS oxide.

Typically, the concentration of the first type dopant within layer 11 ranges from about $10^{19}$ cm$^{-3}$ to about $10^{22}$ cm$^{-3}$, wherein the dopant is composed of boron. In another embodiment, the concentration of the first type dopant within layer 11 ranges from about $10^{20}$ cm$^{-3}$ to about $10^{21}$ cm$^{-3}$, wherein the dopant is composed of boron.

The dielectric layer having the first conductivity type dopant 11 typically has a thickness from about 10 nm to about 500 nm. The dielectric layer having the first conductivity type dopant 11 can also have a thickness ranging from about 20 nm to about 100 nm.

In one embodiment, the protective dielectric layer 12, which may be optionally employed, may be composed of a nitride, oxide, or oxynitride material, so long as the material utilized for the protective dielectric layer 12 provides for etch selectivity with respect to the dielectric layer having the first conductivity type dopant 11. In one embodiment, the protective dielectric layer 12 is composed of silicon nitride. The protective dielectric layer 12 may be formed using deposition methods, such as chemical vapor deposition (CVD), or may be formed using a growth process, such as thermal growth. The protective dielectric layer 12 may have a thickness ranging from about 5 nm to about 20 nm. More typically, the protective dielectric layer 12 may have a thickness of about 10 nm.

Still referring to FIG. 8, and in a following process step, the dielectric stack is patterned and etched to provide an implant mask exposing a portion of the semiconductor-containing layer 8 utilizing photolithography and etching. In one embodiment, a pattern is produced by applying a photoresist layer to the surface to be etched, exposing the photoresist layer to a pattern of radiation, and then developing the pattern into the photoresist layer utilizing a resist developer. Once the patterning of the photoresist layer is completed, the sections covered by the dielectric stack are protected, while the exposed regions are removed using a selective etching process that removes the unprotected regions.

In one embodiment, the patterned photoresist is utilized to etch the protective dielectric layer 12, wherein following etch of the protective dielectric layer 12, the protective dielectric layer 12 is utilized as an etch mask during etching of the dielectric layer having the first conductivity type dopant 11. In one embodiment, the protective dielectric layer 12 may be omitted.

The dielectric having the first conductivity type dopant 11 may be etched using an anisotropic etch process, such as reactive ion etch (RIE). The etch process may include a selective etch chemistry, wherein the dielectric layer having the first conductivity type dopant 11 is etched selective to the semiconductor-containing layer 8. As used herein, the term selective in reference to a material removal process denotes that the rate of material removal for a first material is greater than the rate of removal for at least another material of the structure to which the material removal process is being applied. Following etching of the dielectric layer having the first conductivity type dopant 11, the photomask may be removed using a chemical stripping process or oxygen ashing.

Figure 9:
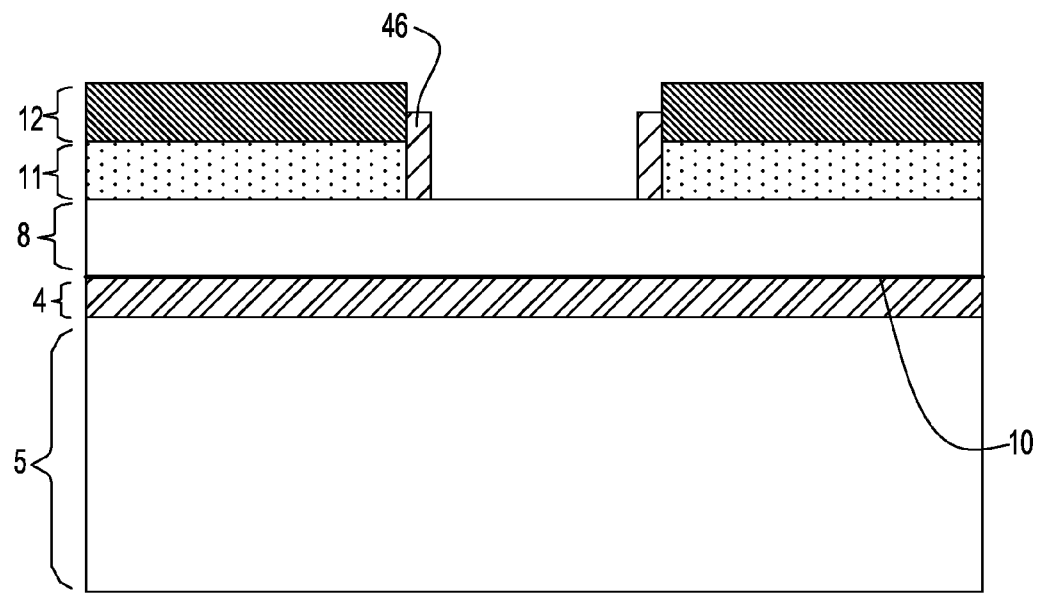
FIG. 9 is a side cross-sectional view depicting forming a spacer on a sidewall of the semiconductor-containing layer, in accordance with the present invention.

Referring to FIG. 9, an optional spacer 46 may be formed on a sidewall of the dielectric layer having the first conductivity type dopant 11. The spacer 46 may be composed of a dielectric material, such as an oxide, nitride, or oxynitride. The spacer 46 may be formed using deposition and etch processes.

Figure 10:
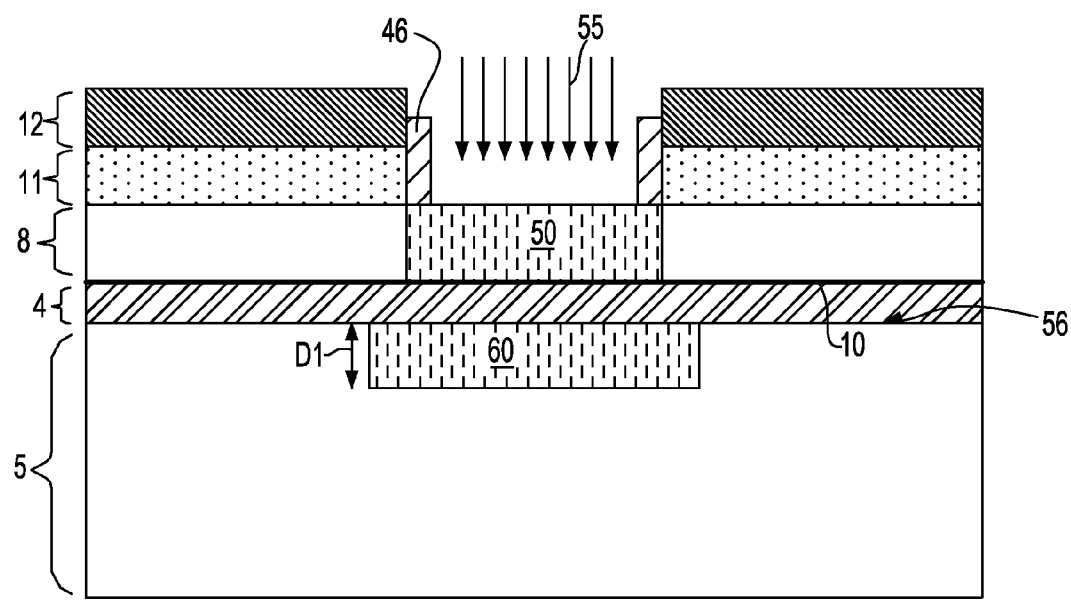
FIG. 10 is a side cross-sectional view depicting implanting a second type dopant into the exposed portion of the semiconductor-containing layer to provide an upper gate and into the substrate underlying the semiconductor-containing layer to provide a back gate, in accordance with one embodiment of the present invention.

FIG. 10 depicts implanting a gate-electrode dopant 55 into the substrate 5. The gate-electrode dopant 55 that is implanted into the exposed portion of the semiconductor-containing layer 8 provides an upper gate structure 50. In one embodiment, the gate dopant 55 that is implanted into the exposed portion of the semiconductor-containing layer 8 is implanted at an energy to travel through the exposed portion of the semiconducting layer 8, through the dielectric layer 4 underlying the exposed portion of the semiconducting layer 8, and form a back gate structure 60 in the semiconductor substrate 5 underlying the dielectric layer 4.

The implanting of the gate dopant 55 may include ion implantation. The implanting of the gate dopant 55 may be a single implant or may include multiple implants, wherein the dopant type, dopant energy, and dopant concentration is selected depending on the required characteristics of the upper gate structure 50 and the back gate structure 60.

The implanting of the gate dopant 55 introduces a second conductivity type dopant to provide the upper gate structure 50. For example, in one embodiment, when the dielectric layer having the first conductivity type dopant 11 is composed of an n-type dopant, which provides the dopant for the source region 16 and drain region 17 of the device during subsequent thermal process steps, the second conductivity type dopant is a p-type dopant. In this configuration, wherein the conductivity type of the source region 16 and drain region 17 is opposite the conductivity type of the upper gate structure 50, and there is no dielectric structure, such as a spacer, isolating the upper gate structure 50 from the source region 16 and the drain region 17, the upper gate structure 50 is a junction isolated upper gate.

The gate-electrode dopant 55 implant to provide the upper gate structure 50 is second conductivity type dopant, e.g., boron, having an ion dosage of about $10^{15}$ atoms/cm$^2$ or greater, using an ion implant apparatus using an energy ranging from about 1.0 keV to about 10.0 keV. In one embodiment, the gate dopant 55 implant to provide the back gate structure 60 is second conductivity type dopant, e.g., boron, having an ion dosage of about $10^{15}$ atoms/cm$^2$ or greater, using an ion implant apparatus using an energy ranging from about 5.0 keV to about 40.0 keV.

The implanting of the gate-electrode dopant 55 typically introduces a second conductivity type dopant to provide the back gate structure 60. The concentration of the second conductivity type dopant 55 that is present in the back gate structure 60 ranges from about $10^{19}$ cm$^{-3}$ to about $10^{21}$ cm$^{-3}$, wherein the dopant is composed of boron. In another embodiment, the concentration of the second conductivity type dopant 55 that is present in the back gate structure 60 ranges from about $6 \times 10^{19}$ cm$^{-3}$ to about $6 \times 10^{20}$ cm$^{-3}$, wherein the dopant is composed of boron.

In one embodiment, by providing a back gate structure 60 of a second type dopant, e.g., p-type, in a portion of the semiconductor substrate 5 having a well composed of a first type dopant, e.g., n-type, with no dielectric structure isolating the back gate structure 60 from the well of the semiconductor substrate 5, the back gate structure 60 is a junction isolated back gate. It is noted that embodiments, of the present invention have been contemplated, in which the back gate structure 60 is composed of a first type dopant, e.g., n-type, and the well region of the semiconductor substrate 5 is a second type dopant, e.g. p-type.

As illustrated in FIG. 10, the portion of the semiconductor substrate 5 in which the back gate structure 60 is present extends from an interface 56 of the semiconductor substrate 5 and the dielectric layer 4 by a dimension $D_1$ extending into the semiconductor substrate 5 and having a value ranging from about 10 nm to about 300 nm. The interface 56 of the semiconductor substrate 5 and the insulating layer 4 is the point of direct physical contact between the two structures. In another embodiment, the portion of the semiconductor substrate 5 in which the back gate structure 60 is present extends from an interface 56 of the semiconductor substrate 5 and the insulating layer 4 by a dimension $D_1$ extending into the semiconductor substrate 5 and having a value ranging from about 10 nm to about 100 nm.

Figure 11:
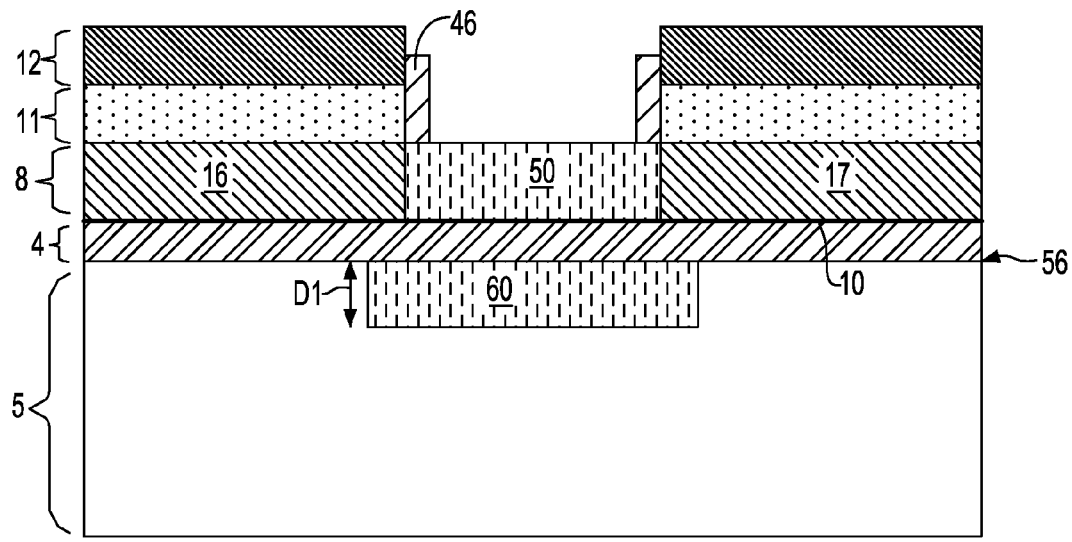
FIG. 11 is a side cross-sectional view depicting annealing of the structure depicted in FIG. 10, in accordance with one embodiment of the present invention.

Referring to FIG. 11, in one embodiment, following the gate dopant implant 55, an annealing process is conducted to diffuse the first conductivity type dopant from the dielectric layer having the first conductivity type dopant 11 into the underlying semiconductor-containing layer 8, such as a silicon carbon containing semiconductor layer, to provide the source region 16 and drain region 17 of the device.

The annealing process may include a temperature ranging from about 900° C. to about 1200° C. In another embodiment, the annealing process includes a temperature ranging from about 950° C. to about 1100° C. In an even further embodiment, the annealing process includes a temperature ranging from about 975° C. to about 1050° C. In one embodiment, the annealing process includes a furnace anneal, such as rapid thermal anneal.

In one embodiment, the source region 16 and the drain region 17 are degenerately doped. By "degenerately doped" it is meant that the Fermi level is outside of the bandgap, i.e. above the conduction band, in the case of a degenerately doped n-type region, or below the valence band, in the case of a degenerately doped p-type region. In other embodiments, the concentration of the first type dopant that is present in the source region 16 and the drain region 17 following the anneal process ranges from about $10^{19}$ cm$^{-3}$ to about $10^{21}$ cm$^{-3}$.

In one embodiment, in which the semiconductor-containing layer 8 is composed of silicon carbon (SiC) and the first type dopant is nitrogen, the first type dopant that is present in the source region 16 and the drain region 17 ranges from about $10^{19}$ cm$^{-3}$ to about $10^{21}$ cm$^{-3}$. In another embodiment, in which the semiconductor-containing layer 8 is composed of silicon carbon (SiC) and the first type dopant is nitrogen, the first type dopant that is present in the source region 16 and the drain region 17 ranges from about $6\times10^{19}$ cm$^{-3}$ to about $6\times10^{20}$ cm$^{-3}$.

Following annealing, the protective dielectric layer 12 and the dielectric layer having the first conductivity type dopant 11 may be removed using etching, planarization or a combination thereof. At this point of the process, contacts may be formed to the source region 16, drain region 17, the upper gate structure 50 and the back gate structure 60 using conventional processing.

FIGS. 12-16 depict one embodiment of a method of forming a semiconductor device having a back gate structure 60 that is encapsulated in an insulating layer. In one embodiment, the method depicted in FIGS. 12-16 may be utilized to produce a structure that is similar to the semiconducting device that is depicted in FIG. 4.

Figure 12:
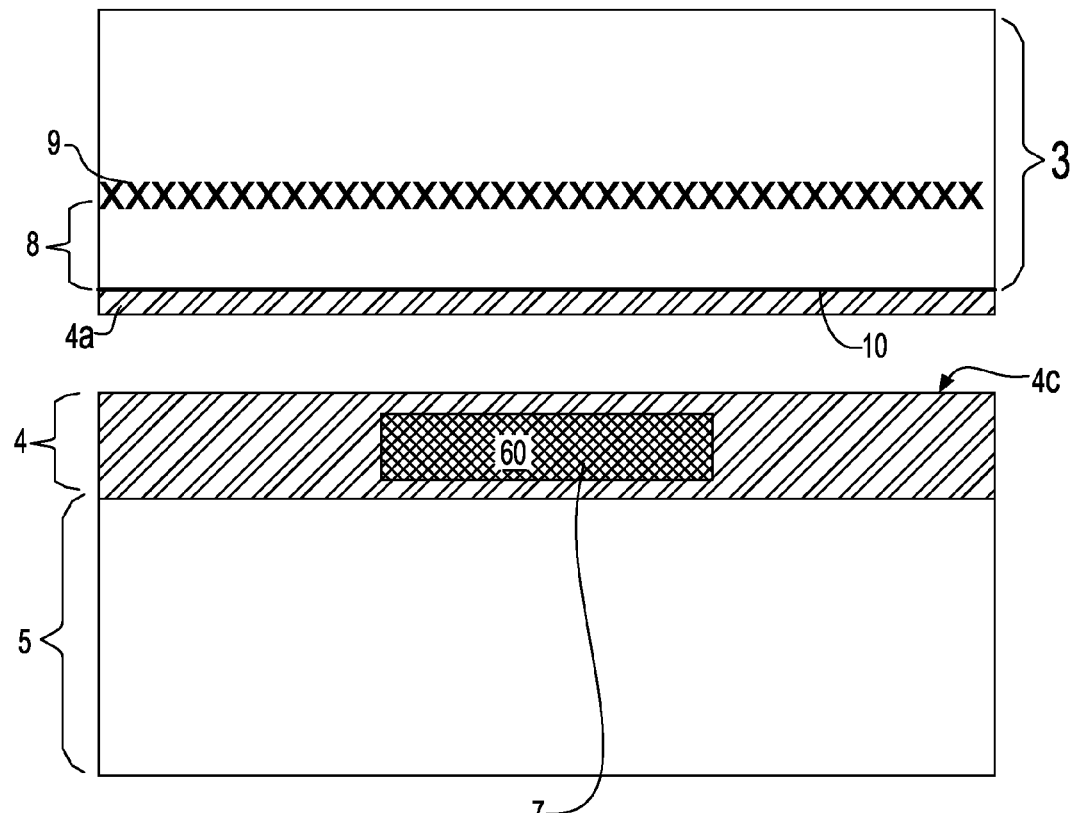
FIG. 12 is a side cross-sectional view of an initial process step for another embodiment of a method for forming a semiconductor device having at least one graphene layer for a channel, wherein the structure depicted in FIG. 5 is bonded to a bulk semiconductor substrate, in accordance with the present invention.

Referring to FIG. 12, in one embodiment, the structure depicted in FIG. 5 is inverted and bonded to a semiconductor substrate 5, wherein a dielectric layer 4 that encapsulates a back gate conductor 7 is present atop the semiconductor substrate 5. In one embodiment, the semiconductor substrate 5 is provided from a bulk semiconductor substrate having an insulating layer, such as an oxide, e.g. silicon oxide, positioned thereon. In a following step, an etch process provides a notch in the insulting layer, wherein the notch is filled with a conductive material that provides the back gate conductor 7, which provides the back gate structure 60 of the device. The conductive material that provides the back gate conductor 7 may be polysilicon or a metal. Examples of metals that may provide the back gate structure 60 include but are not limited to tungsten, or molybdenum. In another example, the back gate structure 60 may be polysilicon doped with arsenic, wherein the dopant is present in a concentration ranging from $10^{19}$ cm$^{-3}$ to about $10^{22}$ cm$^{-3}$.

Following formation of the back gate conductor 7, a second insulating layer may be deposited atop the back gate conductor 7 followed by a planarization process, wherein the planarization process provides a planar dielectric surface 4c that is to be bonded to the first dielectric layer 4a. The bonding method is similar to the method described above with reference to FIGS. 5-11. Hereafter, the insulating layer having the planar dielectric surface 4c and the first dielectric layer 4a are jointly referred to as a dielectric layer 4.

Figure 13:
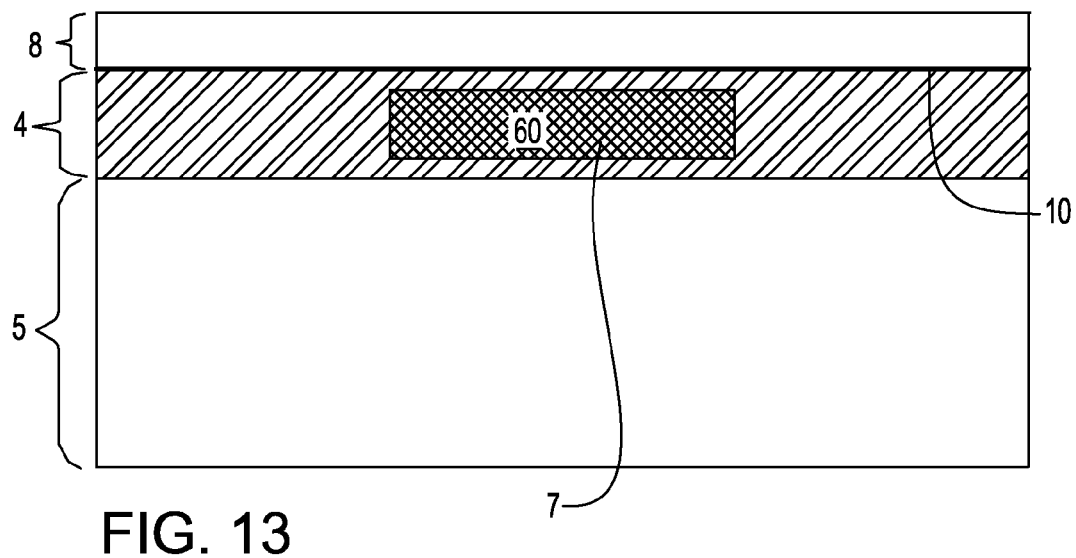
FIG. 13 is a side cross-sectional view of a planarization step applied to the upper surface of the structure depicted in FIG. 12, in accordance with one embodiment of the present invention.

Referring to FIG. 13 and in a following process step, during bonding or following bonding, the carrier substrate 3 is then separated about the damaged interface 9, in which a portion of the carrier substrate 3 positioned below the damaged region 9 is removed and a portion 8 of the substrate 3 above the damaged interface 9 remains. In one embodiment, the remaining portion 8 of the substrate 3 is then subjected to a planarization process, such as chemical mechanical polishing (CMP) or grinding. The remaining portion 8 of the substrate 3 is hereafter referred to as the semiconductor-containing layer 8.

Figure 14:
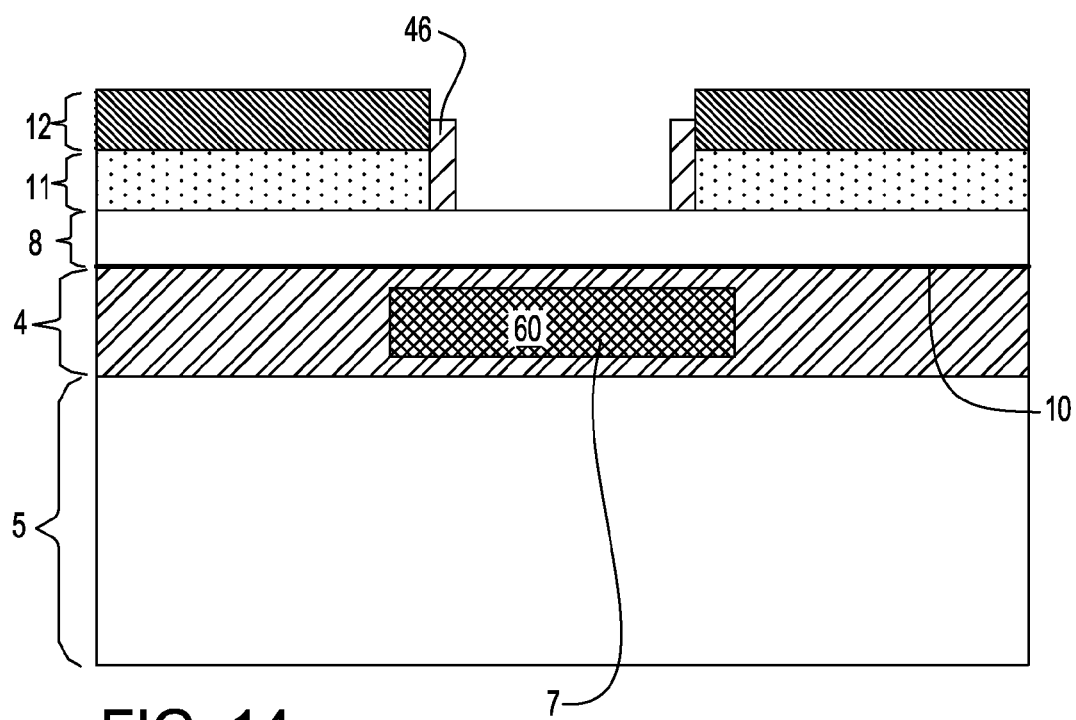
FIG. 14 is a side cross-sectional view depicting forming a dielectric layer atop the structure depicted in FIG. 13, the dielectric layer including a first conductivity type dopant atop the semiconductor-containing layer and patterning and etching the dielectric layer to expose a portion of the semiconductor-containing layer, in accordance with one embodiment of the present invention.
Figure 15:
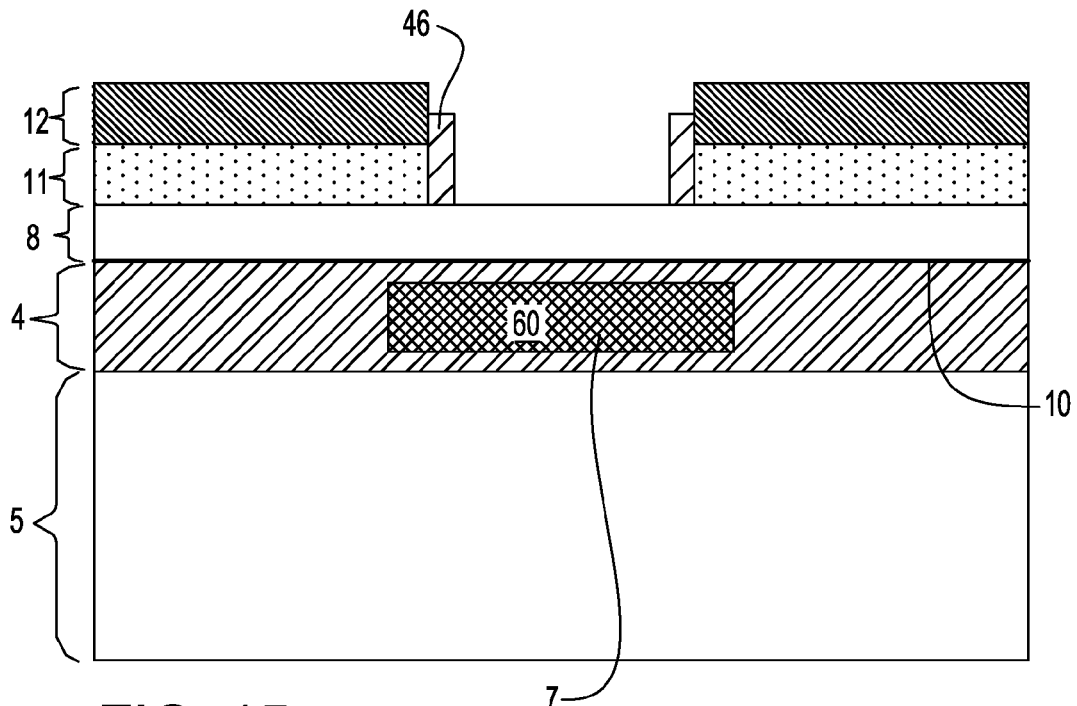
FIG. 15 is a side cross-sectional view depicting forming an optional spacer on a sidewall of the semiconductor-containing layer, in accordance with one embodiment of the present invention.

Referring to FIG. 14, in one embodiment, a dielectric stack is then formed atop the semiconductor-containing layer 8, wherein the dielectric stack includes a dielectric layer having the first conductivity type dopant 11 atop the semiconductor-containing layer 8, and a protective dielectric layer 12 atop the dielectric layer having the first conductivity type dopant 11. In a following process step, the dielectric stack is patterned and etched to provide an implant mask exposing a portion of the semiconductor-containing layer 8 utilizing photolithography and etch process steps. The details of the process steps that provide the structure depicted in FIG. 14 are described above with reference to FIG. 8. Referring to FIG. 15, an optional spacer 46 is then typically formed on a sidewall of the dielectric layer having the first conductivity type dopant 11.

Figure 16:
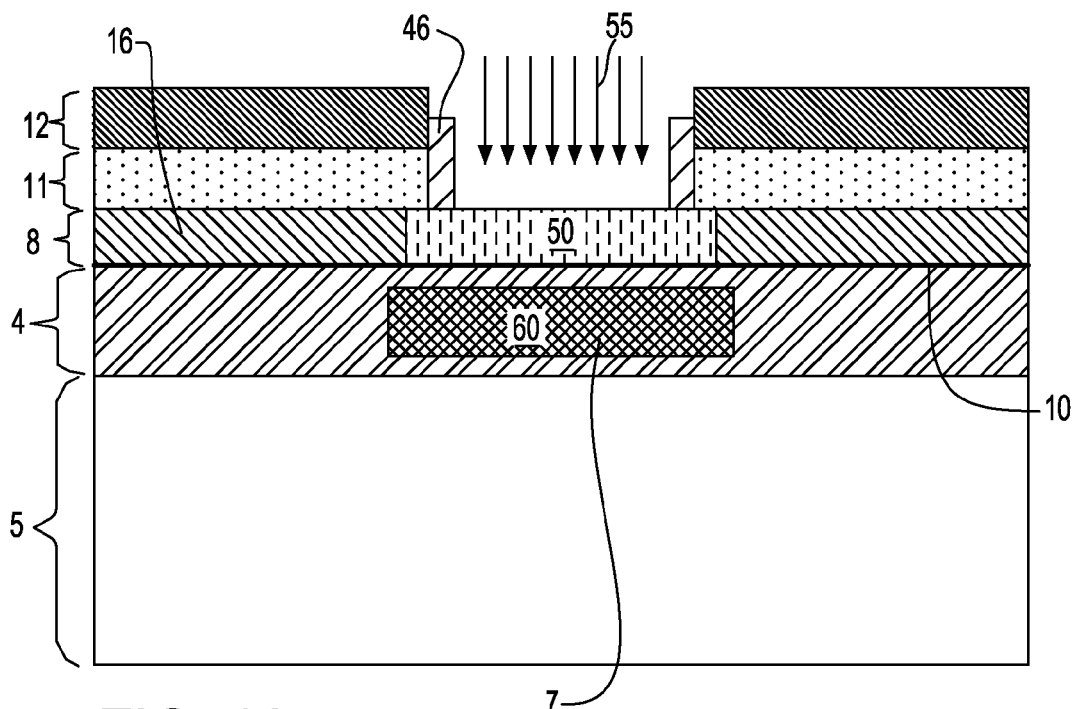
FIG. 16 is a side cross-sectional view depicting forming annealing to functionalize the at least one graphene layer, in accordance with one embodiment of the present invention.

FIG. 16 depicts one embodiment of implanting a gate dopant 55 into the exposed portions of the semiconductor-containing layer 8. The gate dopant 55 that is implanted into the exposed portion of the semiconductor-containing layer 8 provides an upper gate structure 50. The gate dopant 55 implant to provide the upper gate structure 50 may be a second conductivity type dopant, e.g., boron, having an ion dosage of about $10^{15}$ atoms/cm$^2$ or greater using an energy ranging from about 1.0 keV to about 10.0 keV. In this embodiment, of the present invention it is not necessary to implant the back gate structure 60 during the gate dopant implant 55 that provides the upper gate structure 50. Following the gate-electrode dopant implant 55, an annealing process is conducted to diffuse the first conductivity type dopant from the dielectric layer having the first conductivity type dopant 11 into the underlying semiconductor-containing layer 8, such as a silicon carbon containing semiconductor layer, to provide the source region 16 and drain region 17 of the device.

In one embodiment, following annealing, the protective dielectric layer 12 and the dielectric layer having the first conductivity type dopant 11 may be removed using etching, planarization or a combination thereof. At this point of the process, contacts may be formed to the source region 16, drain region 17, the upper gate structure 50 and the back gate structure 60 using conventional processing.

Figure 17:
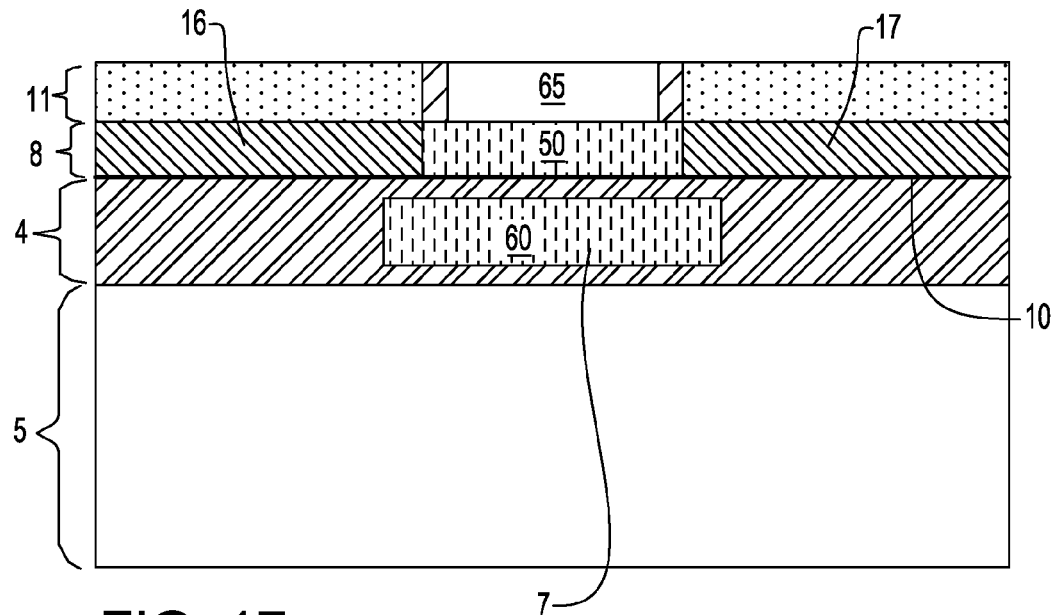
FIG. 17 is a side cross-sectional view depicting planarizing the upper surface of the structure depicted in FIG. 16, in accordance with one embodiment of the present invention.
Figure 18:
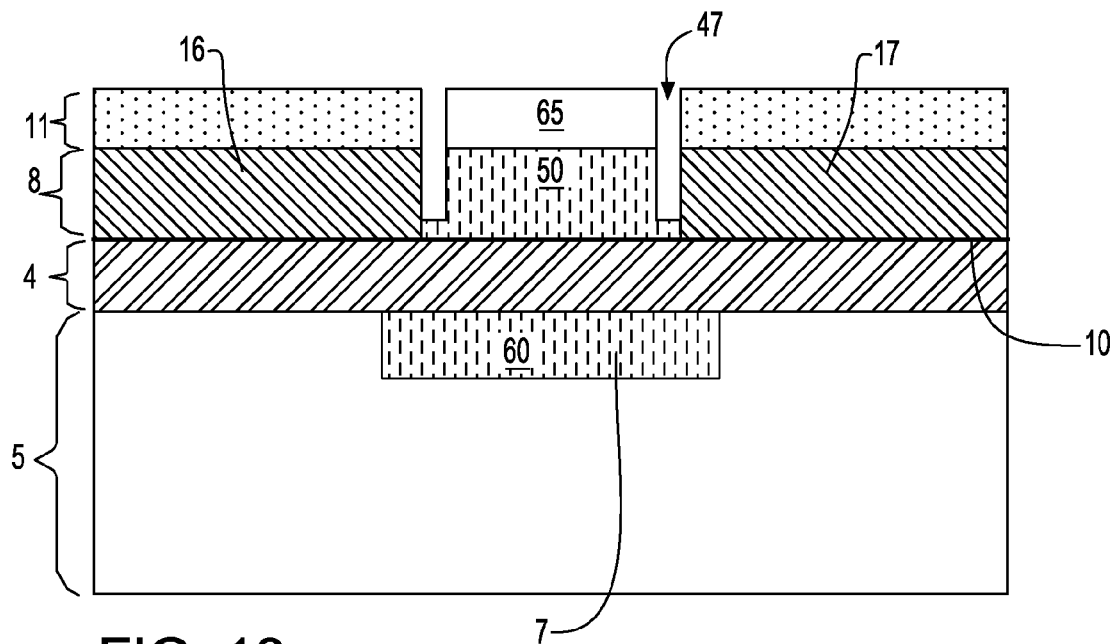
FIG. 18 is a side cross-sectional view depicting recessing the optional spacer, in accordance with the present invention.
Figure 19:
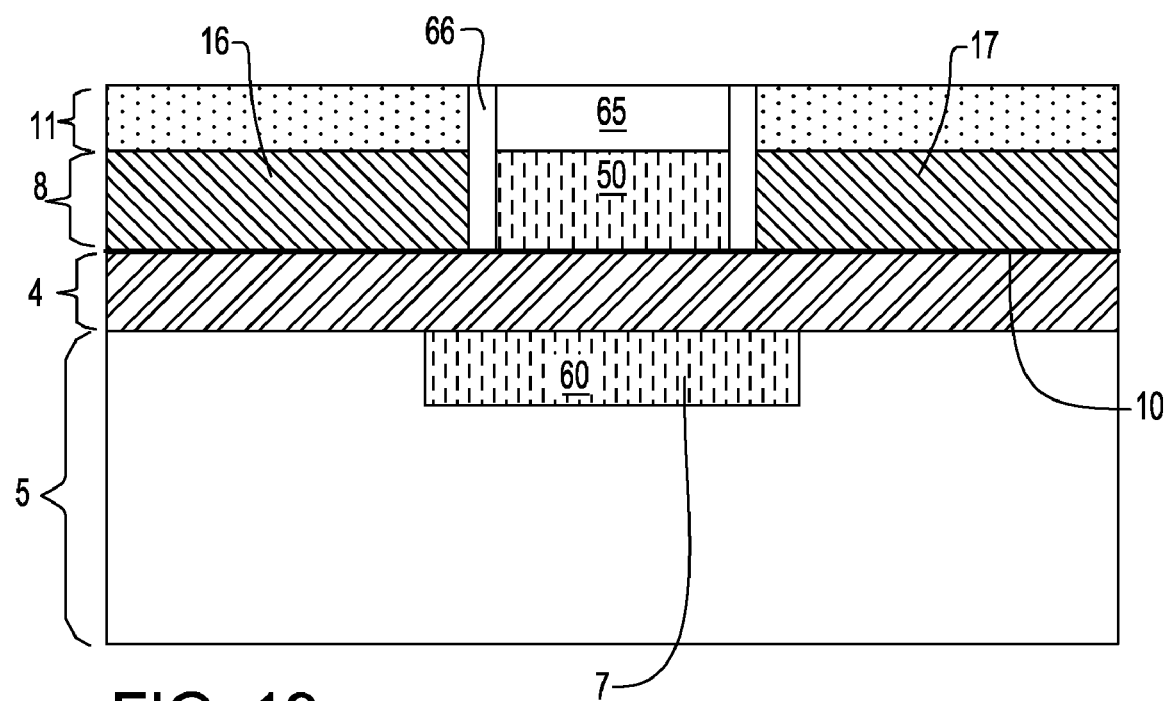
FIG. 19 is a side cross-sectional view depicting depositing a dielectric layer atop the structure depicted in FIG. 18, in accordance with one embodiment of the present invention.

FIGS. 17-19 depict embodiments of a method for forming a semiconductor device 100 having a insulator isolated upper structure 50. In one embodiment, the method depicted in FIGS. 17-19 may be utilized to produce a structure having an insulator isolated upper gate structure 50 that is similar to the semiconducting device 100 that is depicted in FIGS. 2 and 3.

In one embodiment, a method to provide a final semiconductor device structure similar to that depicted in FIG. 2 begins with the structure depicted in FIG. 11. In one embodiment, a method to provide a final semiconductor device structure similar to that depicted in FIG. 3 begins with the structure depicted in FIG. 16. Although the following description produces the structure depicted in FIG. 3, the method steps discussed hereafter are suitable for producing the structure depicted in FIG. 2, so long as the initial structure begins with the structure depicted in FIG. 11.

Referring to FIG. 17, an etched-back layer 65 is deposited atop the structure depicted in FIG. 16, wherein the etched-back layer 65 fills the opening in the ion implantation mask that is provided by the patterned and etched protective dielectric layer 12. In one embodiment, the etched-back layer 65 is composed of any dielectric material, such as an oxide, nitride or oxynitride material, so long as the dielectric material allows for etching the spacer 46 selective to the dielectric layer having the first conductivity type dopant 11 and the etch back layer 65. The etched-back layer 65 is typically deposited using chemical vapor deposition and is then planarized so that the upper surface of the etched-back layer 65 is coplanar with the upper surface of the spacer 46 and the upper surface of the dielectric layer having the first conductivity type dopant 11.

Referring to FIG. 18, an etch process then removes the spacer 46. The spacer 46 may be removed by an etch process having a selective etch chemistry that removes the spacer 46 selective to the dielectric layer having the first conductivity type dopant 11, and the semiconductor containing layer 8. The etch process may include a reactive ion etch or may be a wet chemical etch. In one embodiment, removing the spacer 46 produces an opening that may be used as at etch mask to produce an opening 47 in the underling semiconductor containing layer 8. Opening 47 is typically positioned at an interface of the source region 16 and the upper gate structure 50, and an opening 47 is positioned at an interface of the drain region 17 and the upper gate 50. In one embodiment, the opening 47 has a width ranging from about 5 nm to about 50 nm.

Referring to FIG. 19 and in a following step, a spacer dielectric layer 66 is deposited atop the structure depicted in FIG. 18. In one embodiment, the spacer dielectric layer 66 fills the openings 47 that are positioned at the interface of the source region 16 and the upper gate structure 50, and the interface of the drain region 17 and the upper gate structure 50. In one embodiment, the spacer dielectric layer 66 is composed of an oxide, nitride, or oxynitride material that may be deposited by chemical vapor deposition. In one embodiment, the spacer dielectric layer 66 is composed of silicon nitride.

Following deposition of the spacer dielectric layer 66, a planarization process is applied to the upper surface of the structure depicted in FIG. 19 to provide the structure depicted in FIG. 2 that includes a dielectric spacer 45 separating the first gate structure 50 from the source region 16 and the drain region 17 of the semiconductor device 100. In one embodiment, because a dielectric material, i.e., the dielectric spacer 45, is positioned between the upper gate structure 50 and the source region 16 and drain region 17 of the semiconductor device 100, the upper gate structure 50 is said to be an insulator-isolated upper-gate structure 50.

While the present invention has been particularly shown and described with respect to the preferred embodiments thereof, it will be understood by those skilled in the art that the foregoing and other changes in forms of details may be made without departing from the spirit and scope of the present invention. It is therefore intended that the present invention not be limited to the exact forms and details described and illustrated, but fall within the scope of the appended claims.

What is claimed:

1. A semiconductor device comprising:
    a substrate having a dielectric layer;
    at least one graphene layer overlying the dielectric layer;
    a back gate structure underlying the at least one graphene layer; and
    a semiconductor-containing layer present on the at least one graphene layer, the semiconductor-containing layer including a source region and a drain region separated by an upper gate structure, wherein the upper gate structure is positioned overlying the back gate structure.

2. The semiconductor device of claim 1, wherein the at least one graphene layer comprises a single layer of carbon atoms.

3. The semiconductor device of claim 1, wherein the at least one graphene layer comprises up to 20 layers of carbon atoms.

4. The semiconductor device of claim 1, wherein the upper gate structure is separated from the source region and the drain region by a dielectric spacer.

5. The semiconductor device of claim 1, wherein the upper gate structure is a junction isolated gate.

6. The semiconductor device of claim 4, wherein the back gate structure is an insulated back gate structure that is present underlying the dielectric layer.

7. The semiconductor device of claim 5, wherein the back gate structure is an insulated back gate structure that is present underlying the dielectric layer.

8. The semiconductor device of claim 4, wherein the back gate structure is enclosed within the dielectric layer.

9. The semiconductor device of claim 5, wherein the back gate structure is enclosed within the dielectric layer.

10. The semiconductor device of claim 1, wherein the dielectric layer comprises silicon oxide.

11. A method of manufacturing a semiconductor device comprising:
    providing at least one graphene layer on a substrate and a semiconductor-containing layer on the at least one graphene layer;
    forming a dielectric layer comprising a first conductivity type dopant on the semiconductor-containing layer;
    etching the dielectric layer comprising the first conductivity type dopant to expose a portion of the semiconductor-containing layer;
    implanting a gate dopant of a second conductivity type, opposite that of the first conductivity type, into the exposed portion of the semiconductor-containing layer to provide an upper gate structure and into the substrate underlying the upper gate structure to provide a back gate structure; and
    diffusing the first conductivity type dopant from the dielectric layer comprising the first conductivity type dopant into the semiconductor-containing layer to provide a source region and a drain region adjacent to the upper gate structure.

12. The method of claim 11, wherein the silicon-containing layer comprises silicon carbon and the providing of the at least one graphene layer comprises annealing the silicon carbon.

13. The method of claim 12, wherein the annealing of the silicon carbon comprises heating the silicon carbon at about 900° C. to about 1200° C.

14. The method of claim 11, wherein the forming of the dielectric layer comprises silicon oxide and the first conductivity type dopant comprises nitrogen.

15. The method of claim 11, wherein the gate dopant is composed of a second type dopant.

16. A method of manufacturing a semiconductor device comprising:
    providing at least one graphene layer on a carrier substrate;

providing a semiconductor substrate including a buried dielectric layer positioned thereon, wherein a back gate structure is present enclosed within the buried dielectric layer;

bonding the at least one graphene layer on the carrier substrate to the buried dielectric layer that is positioned on the semiconductor substrate;

removing a portion of the carrier substrate, wherein a remaining portion of the carrier substrate provides a semiconductor-containing layer;

forming a dielectric layer comprising a first conductivity type dopant on the semiconductor containing layer;

patterning and etching the dielectric layer comprising the first conductivity type dopant to expose a portion of the semiconductor-containing layer;

implanting a gate dopant of a second conductivity type, opposite that of the first conductivity type, into the exposed portion of the semiconductor-containing layer to provide an upper gate structure; and diffusing the first type dopant from the dielectric layer comprising the first type dopant into the semiconductor-containing layer to provide a source region and a drain region adjacent to the upper gate structure.

17. The method of claim 16, wherein the carrier substrate and the semiconductor-containing layer comprises silicon carbon and the providing of the at least one graphene layer comprises annealing the silicon carbon.

18. The method of claim 17, wherein the annealing of the silicon carbon comprises heating the silicon carbon at about 1000° C. to about 1400° C.

19. The method of claim 16, wherein the dielectric layer comprising the first conductivity type dopant comprises silicon oxide and the first conductivity type dopant comprises nitrogen.

20. The method of claim 16, wherein the gate dopant comprises a second conductivity type dopant.

* * * * *